United States Patent
Lidsky et al.

(10) Patent No.: US 6,804,426 B2
(45) Date of Patent: Oct. 12, 2004

(54) DEVICE AND METHOD FOR SIMULTANEOUS MULTIPLE REPRODUCTION OF LIGHTWAVE SIGNALS

(75) Inventors: David Lidsky, Sea Bright, NJ (US); Jithamithra Sarathy, Atlantic Highlands, NJ (US)

(73) Assignee: Alphion Corporation, Eatontown, NJ (US)

(*) Notice: Subject to any disclaimer, the term of this patent is extended or adjusted under 35 U.S.C. 154(b) by 143 days.

(21) Appl. No.: 10/147,332

(22) Filed: May 15, 2002

(65) Prior Publication Data

US 2002/0191888 A1 Dec. 19, 2002

Related U.S. Application Data

(60) Provisional application No. 60/291,251, filed on May 15, 2001.

(51) Int. Cl.[7] ............................................. G02B 6/026
(52) U.S. Cl. ........................................ 385/15; 398/100
(58) Field of Search .............................. 385/15, 16, 50, 385/147; 398/115, 167, 100–102

(56) References Cited

U.S. PATENT DOCUMENTS

| | | | | |
|---|---|---|---|---|
| 6,148,132 A | * | 11/2000 | Hamamoto | ................ 385/131 |
| 6,208,454 B1 | * | 3/2001 | Koren et al. | ................ 359/326 |
| 6,335,819 B1 | * | 1/2002 | Cho et al. | ................ 359/333 |
| 6,452,718 B1 | * | 9/2002 | Augustsson | .............. 359/337.1 |
| 6,473,541 B1 | * | 10/2002 | Ho | .............................. 385/15 |
| 6,522,462 B2 | * | 2/2003 | Chu et al. | ................... 359/344 |
| 6,563,627 B2 | * | 5/2003 | Yoo | ........................... 359/326 |
| 6,594,072 B2 | * | 7/2003 | Dave et al. | ................. 359/344 |
| 6,718,094 B1 | * | 4/2004 | Devaux et al. | .............. 385/39 |

* cited by examiner

*Primary Examiner*—Akm Enayet Ullah
(74) *Attorney, Agent, or Firm*—Kaplan & Gilman, LLP (57) ABSTRACT

A single device for amplifying and multiplying an optical signal is presented. The device is an InP-semiconductor-based amplified multimode interferometer. The three main sections of the device are an input port, an interference and amplification region and N output ports. The input port is a single channel waveguide. The interference and amplification section supports a large number of modes which interfere with one another. By carefully choosing the length of the interference/amplification region to correspond to the constructive interference condition for N equally spaced channel modes, we can reproduce N amplified signals. In an alternate embodiment, by shaping the gain region into a cross pattern, corner reflections and consequent side channel signal distortion in the output can be minimized.

27 Claims, 8 Drawing Sheets

FIGURE 1
Top View - Not to Scale

DEVICE AND METHOD FOR SIMULTANEOUS MULTIPLE REPRODUCTION OF LIGHTWAVE SIGNALS

CROSS REFERENCE TO OTHER APPLICATIONS

This application claims the benefit of U.S. Provisional Patent Application No. 60/291,251, filed on May 15, 2001.

TECHNICAL FIELD

This invention relates to telecommunications, and more specifically, to a device and method for the all-optical simultaneous multiple reproduction of optical signals.

BACKGROUND OF THE INVENTION

In a variety of optical data transmission systems, it is necessary to reproduce multiple copies of an original optical signal. Conventionally this is done in one of two ways, either by means of optical-to-electrical-to-optical ("OEO") data multiplication, or by some type of interferometric device. OEO methods are costly in terms of the resources and complicated infrastructure used. As well, OEO methods are format and bit rate sensitive. If data signal multiplication can be done all optically, it saves significant time, space and power resources that must be used in OEO processes. However, using interferometric devices, even if the ideal 100% efficiency can be reached, which is ambitious, the power of the input signal is split among the various copies of the signal. If the input extinction ratio is low to begin with, this could severely limit the copies of the input signal that can be made.

What is needed in the art is a means of multiplying lightwave signals without resort to OEO methods, and without constraints on multiplication due to input signal power limitations.

What is further needed is a means of making numerous copies of an input signal, each copy having an extinction ratio greater than or equal to that of the original input signal.

SUMMARY OF THE INVENTION

A single device for amplifying and multiplying an optical signal is presented. The device is an InP-semiconductor-based amplified multimode interferometer. The three main sections of the device are an input port, an interference and amplification region and N output ports. The input port is a single channel waveguide. The interference and amplification section supports a large number of modes which interfere with one another. By carefully choosing the length of the interference/amplification region to correspond to the constructive interference condition for N equally spaced channel modes, we can reproduce N amplified signals. In an alternate embodiment, by shaping the gain region into a cross pattern, corner reflections and consequent side channel signal distortion in the output can be minimized.

DETAILED DESCRIPTION OF THE PREFERRED EMBODIMENTS

Before one or more embodiments of the invention are explained in detail, it is to be understood that the invention is not limited in its application to the details of construction or the arrangements of components set forth in the following description or illustrated in the drawings (the terms "construction" and "components" being understood in the most general sense and thus referring to and including, in appropriate contexts, methods, algorithms, processes and sub-processes). The invention is capable of other embodiments and of being practiced or being carried out in various ways. Also, it is to be understood that the phraseology and terminology used herein is for the purposes of description and should not be regarded as in any way limiting.

The concept of the present invention is a simple one. In a variety of optical data transmission systems, it is necessary to reproduce multiple copies of an original optical signal. If this can be done all optically, it saves time, space and power resources that must be used in optical-to-electrical-to-optical data multiplication. If the process of making multiple copies and then amplifying them can be combined in one step and done in one integrated device, signal processing and device size can be reduced even further.

The present invention utilizes the self-imaging property of multimode waveguides. Self-imaging is a property of multimode waveguides by which an input field profile is reproduced in single or multiple images at periodic intervals along the propagation direction of the waveguide.

For purposes of illustration herein, the transverse direction across a waveguide will be denoted the y direction, the propogation direction along the waveguide the z direction, and the direction normal to the plane of the top of the waveguide the x direction. An input field to a waveguide, such as a pulse, is thus a function of distance along the transverse direction, y.

By center-feeding the multimode waveguide with a symmetric field profile, imaging is obtained by linear combinations of the (even) symmetric modes, in what is termed in the art symmetric interference. In general, N-fold images of the input field $\Psi(y,0)$ are obtained at distances L, where $$L = p/N^*(3L\pi/4)$$

where p={1, 2, 3 . . . }. Such N images of the input field $\Psi(y,0)$ are symmetrically located along the y axis with equal spacing We/N, where We is the effective width of the waveguide. Since smaller device lengths are desirable in terms of processing and material costs, in general the device length L will be determined by the case where p=1. Thus, given the desired number of copies N, the device length is determined by the above equation using p=1. As an example, for N=3, L=L$\pi$/4. As is known in the art, L$\pi$ is the cross-coupler length.

The length of the waveguide is actually a function of the width, inasmuch as the length is a function of L$\pi$, which is itself generally defined as the beat length of the two lowest order modes according to the equation $L\pi=\pi/(\beta_0-\beta_1)$, which is approximately equal to $4n_rWe2/3\lambda_0$, where $n_r$ is the effective refractive index of the waveguide and $\lambda_0$ is a free-space wavelength with m lateral modes which is supported by the waveguide.

Adding an amplification region to a passive waveguide insures that the N output signals actually duplicate the input signal without dividing the output power of the input signal amongst them. Such amplification is achieved by providng an active region above a passive multimode waveguide, as described below.

Figure 1:
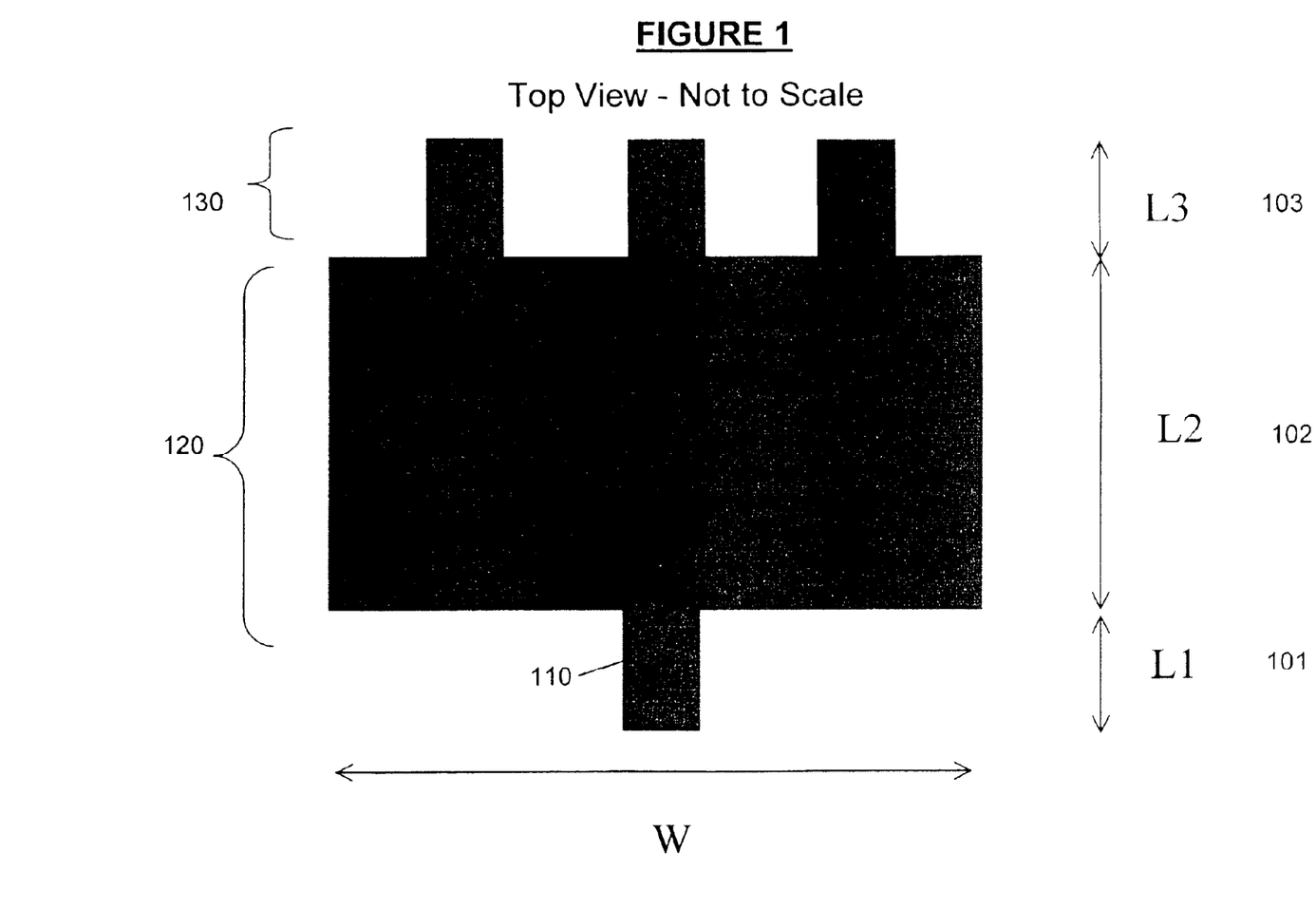
FIG. 1 depicts the device of the present invention according to a first embodiment.

Implementing the abovedescribed properties of multimode waveguides and an active region, FIG. 1 depicts an exemplary device for amplifying and multiplying an optical signal into N outputs, where N=3. The device is an InP-semiconductor-based amplified multimode interferometer. The three main sections of the device are an input port 110, an interference and amplification region 120 and N output ports 130. The input port is a single channel waveguide of length L1 101. The interference and amplification section supports a large number of modes m which interfere with one another. As above, by carefully choosing the length of the interference/amplification region L2 102 to correspond to the constructive interference condition for N equally spaced channel modes, N amplified signals can be reproduced. The output ports have length L3 103. The width of the device is constrained by a desired distance between output ports, and practicalities of minimum waveguide width for the output ports. As seen in FIG. 1, the device of the depicted embodiment is center fed on the input side.

The device consists of an InGaAsP ($\lambda_g=1.24$ $\mu$m) waveguide layer with a gain layer patterned on top. The gain region is formed from the epilayer by photolithography and chemical etching.

Figure 3:
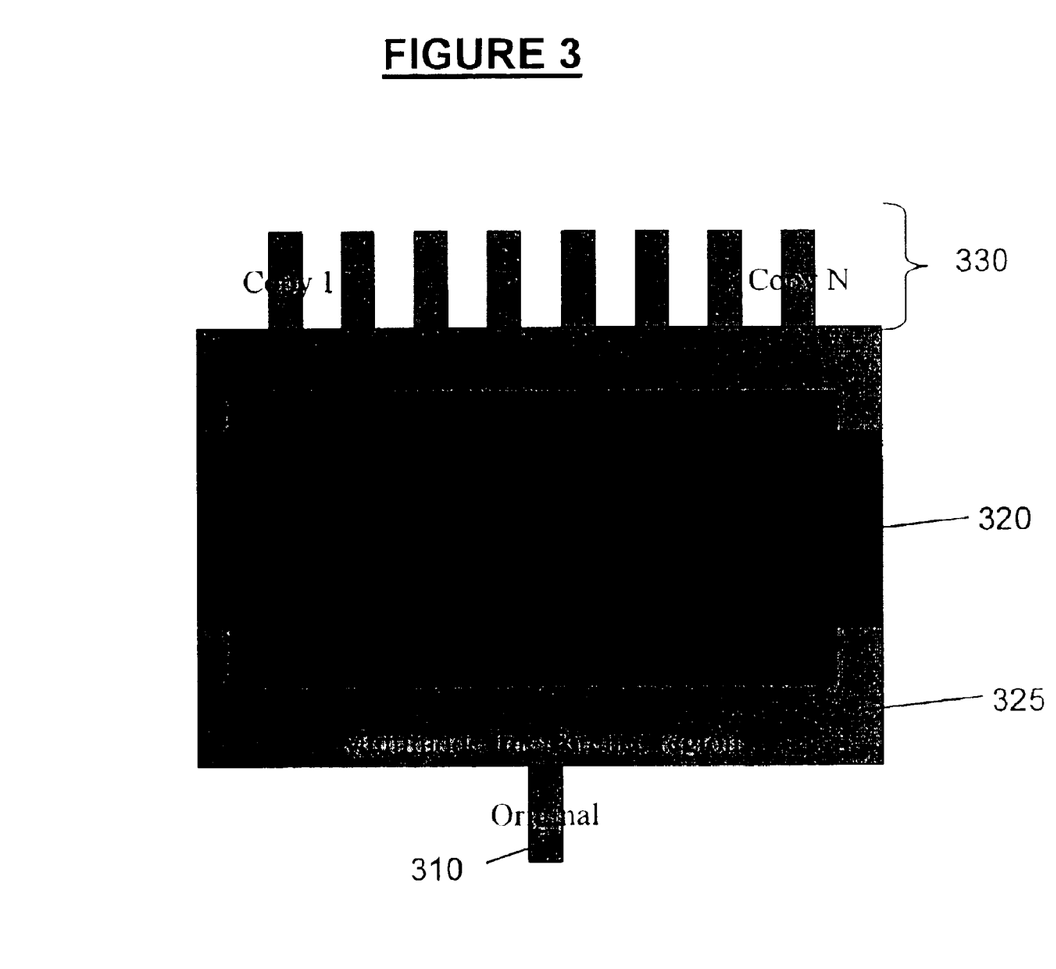
FIG. 3 depicts the device of the present invention according to a second embodiment.

FIG. 3 depicts an alternative embodiment to the device of FIG. 1. In this embodiment the one input 310 is multiplied into N outputs 330. Moreover, by shaping the gain region 320 into a cross pattern, corner reflections and consequent side channel signal distortion in the output can be mnimized. In the embodiment of FIG. 3 the gain region 320 does not totally cover the passive waveguide layer 325 as is done in the embodiment of FIG. 1.

Figure 2:
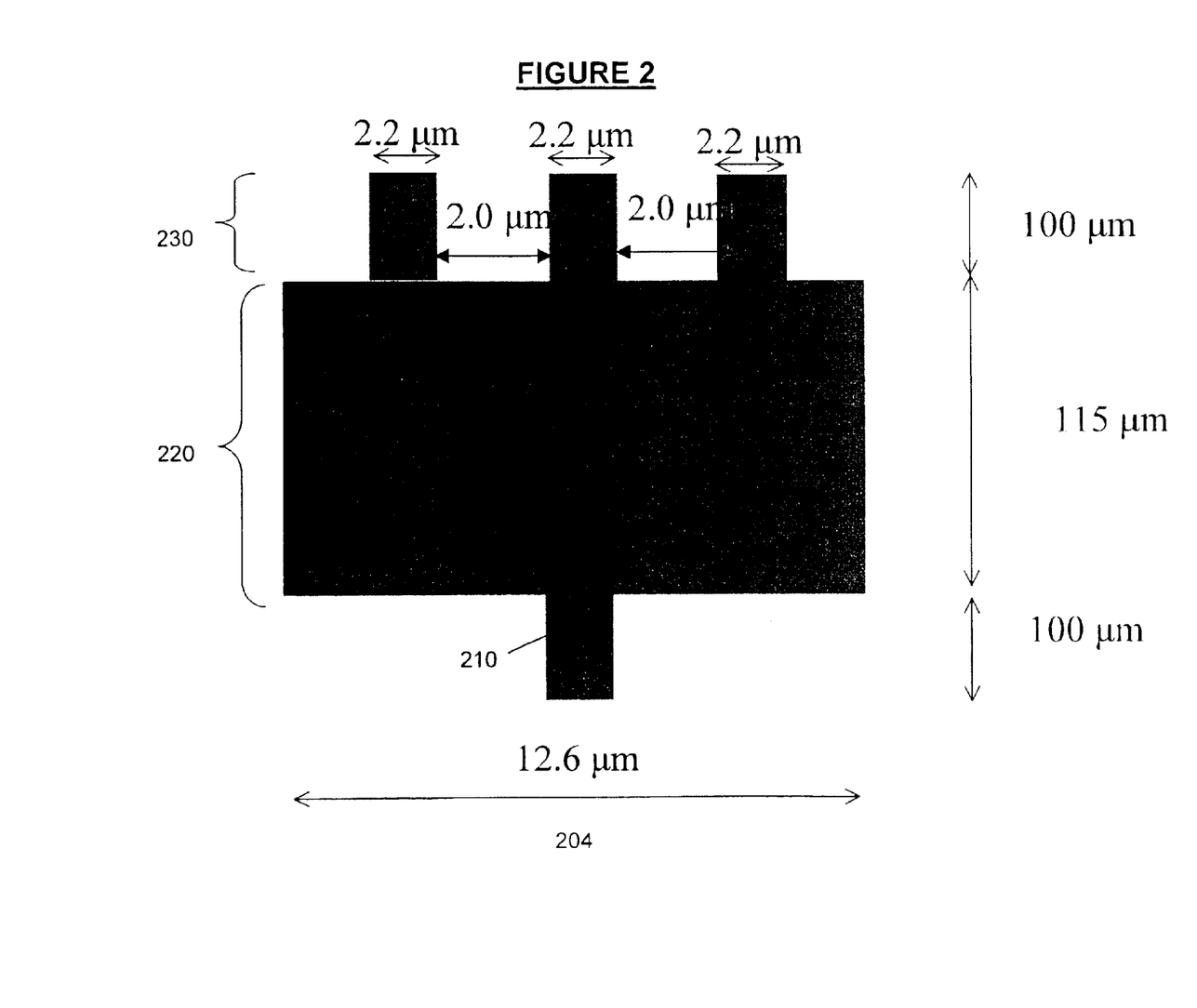
FIG. 2 (not drawn to scale) gives precise device measurements for an exemplary embodiment of the device of FIG. 1.

FIG. 2 (not drawn to scale) gives precise device measurements for an exemplary embodiment of the device of FIG. 1, where N=3. The input waveguide 210 and the output waveguides 230 are each 2.2 microns wide. The overall width of the device 204 is 12.6 microns, and the overall length is 315 microns. The length of the input waveguide 210 and each of the output waveguides 230 is 100 microns, and the length of the MMI and amplification region 220 is 115 microns. The distance between output waveguides 230 is 2.0 microns. As above, given the desired distances between output waveguides, and given the desired waveguide width, an overall device width is set. Using this Width the effective width We is calculated, and given this value $L\pi$ and the device length L is calculated.

Figure 4:
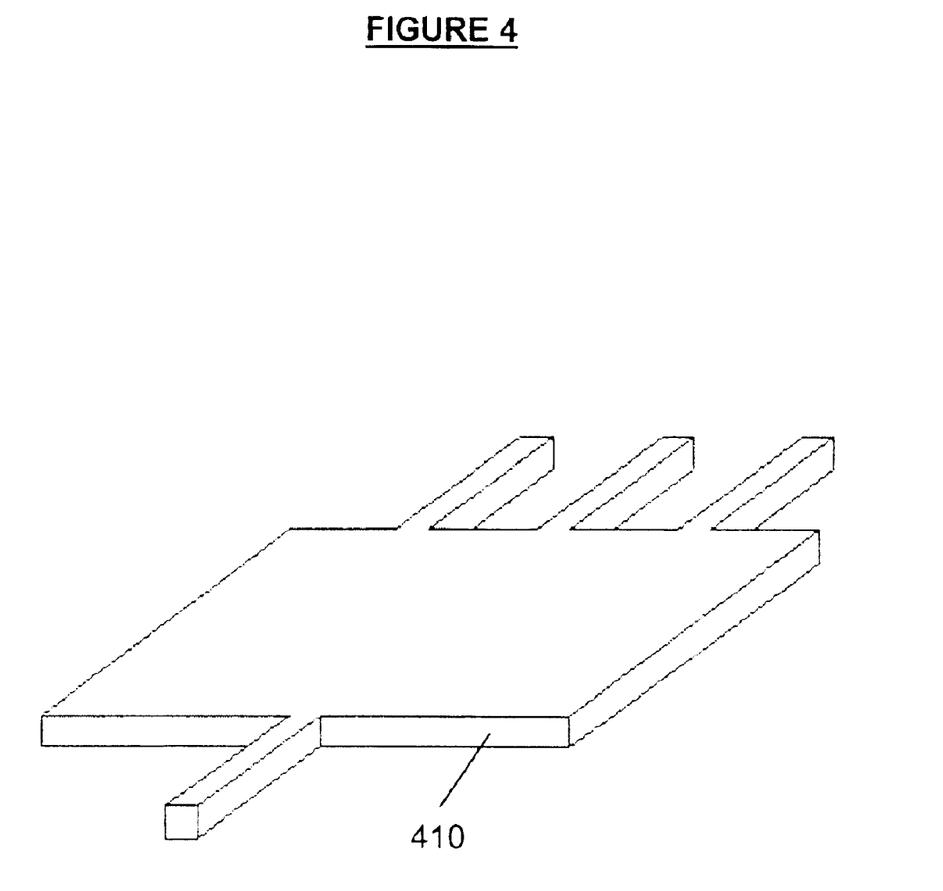
FIG. 4 shows the passive MMI portion of the device of the present invention.
Figure 5:
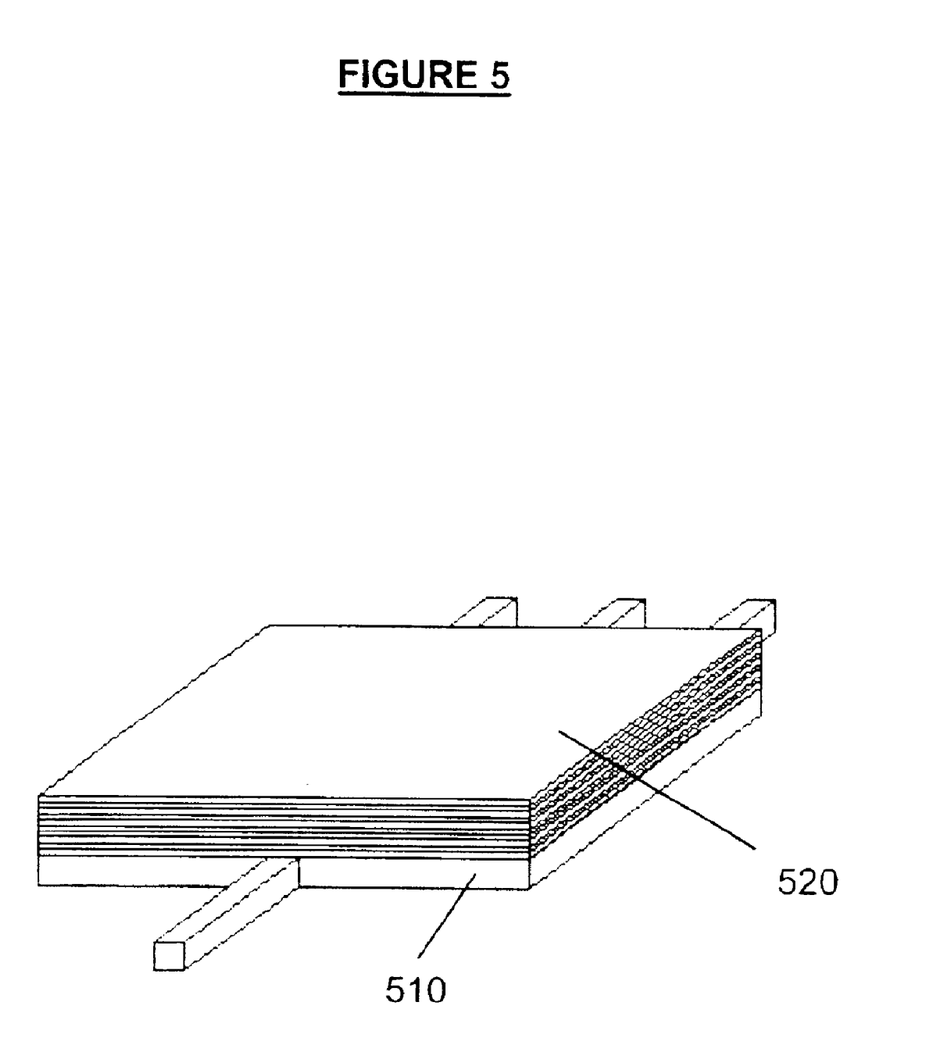
FIGS. 5 and 6 each show the active layer structure atop the passive layer structure according to the present invention.
Figure 6:
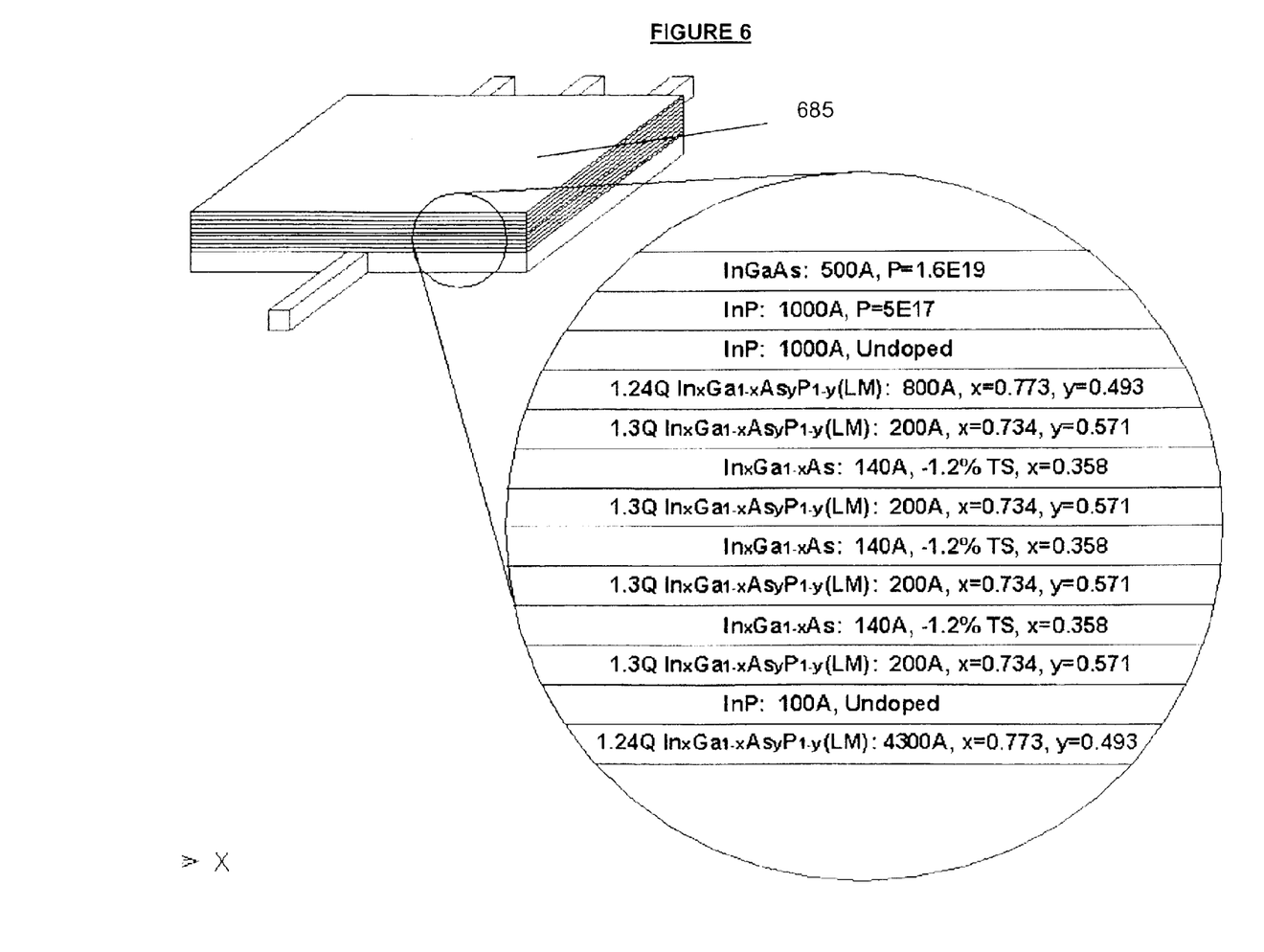

The layer structure of an exemplary embodiment of the invention is depicted in FIGS. 4–6. In these figures a 1×3 device, similar to that of FIG. 1 is shown. FIG. 4 depicts the passive waveguide structure 410. FIG. 5 shows the active regions 520 provided above the passive waveguide 510. FIG. 6 depicts a blowup of layers 3–11 in the exemplary device and gives their composition, which is also listed in Table 1 below. In the table, the abbreviation LM stands for "Lattice Matched" and TS stands for "Tensile Strain." As shown in FIG. 6, and indicated by the loop value of 3, layers 6 and 7 of the active region each appear three times, alternating one with the other. FIG. 6 also depicts the metallic contact 685 provided atop the active region 620. In preferred embodiments it is better to have the contact metal closely match the shape of the active layer in order to reduce contact resistance and have even current disribution. In a preferred embodiment the metallic contact 685 will be made of Ti, W, and Au (mostly Au) and will be ~1.2 microns thick.

TABLE 1

| Layer # | Material | Thickness (Å) | Strain | Loop | Dopant | Comment |
|---|---|---|---|---|---|---|
| 11 | InGaAs (LM) | 500 | 0.00% | 1 | P = 1.6E19 | |
| 10 | InP | 1000 | 0.00% | 1 | P = 5E17 | |
| 9 | InP | 1000 | 0.00% | 1 | undoped | |
| 8 | 1.24 Q $In_xGa_{1-x}As_yP_{1-y}$ (LM) | 800 | 0.00% | 1 | undoped | x = 0.773, y = 0.493 |
| 7 | 1.3 Q $In_xGa_{1-x}As_yP_{1-y}$ (LM) | 200 | 0.00% | 3 | undoped | x = 0.734, y = 0.571 |
| 6 | $In_xGa_{1-x}As$ (TS) | 140 | −1.20% | 3 | undoped | x = 0.358 |
| 5 | 1.3 Q $In_xGa_{1-x}As_yP_{1-y}$ (LM) | 200 | 0.00% | 1 | undoped | x = 0.734, y = 0.571 |
| 4 | InP | 100 | 0.00% | 1 | undoped | |
| 3 | 1.24 Q $In_xGa_{1-x}As_yP_{1-y}$ (LM) | 4300 | 0.00% | 1 | undoped | x = 0.773, y = 0.493 |
| 2 | InP | 2000 | 0.00% | 1 | undoped | |
| 1 | InP | 2000 | 0.00% | 1 | N = 4E18 | Buffer layer 1 |
| 0 | N$^+$ InP | | | | | Substrate |

An exemplary process flow for fabrication of the device of FIG. 6 is as follows:

1) deposit contact metal;
2) pattern active regions;
3) etch active regions;
4) pattern passive regions;
5) etch passive regions;
6) deposit dielectric;
7) open windows in dielectric to contact metal deposited in step 1;
8) pattern bond pads;
9) thin wafer down to desired thickness;
10) deposit backside metal;
11) deposit AR coating; and
12) package.

Figure 7:
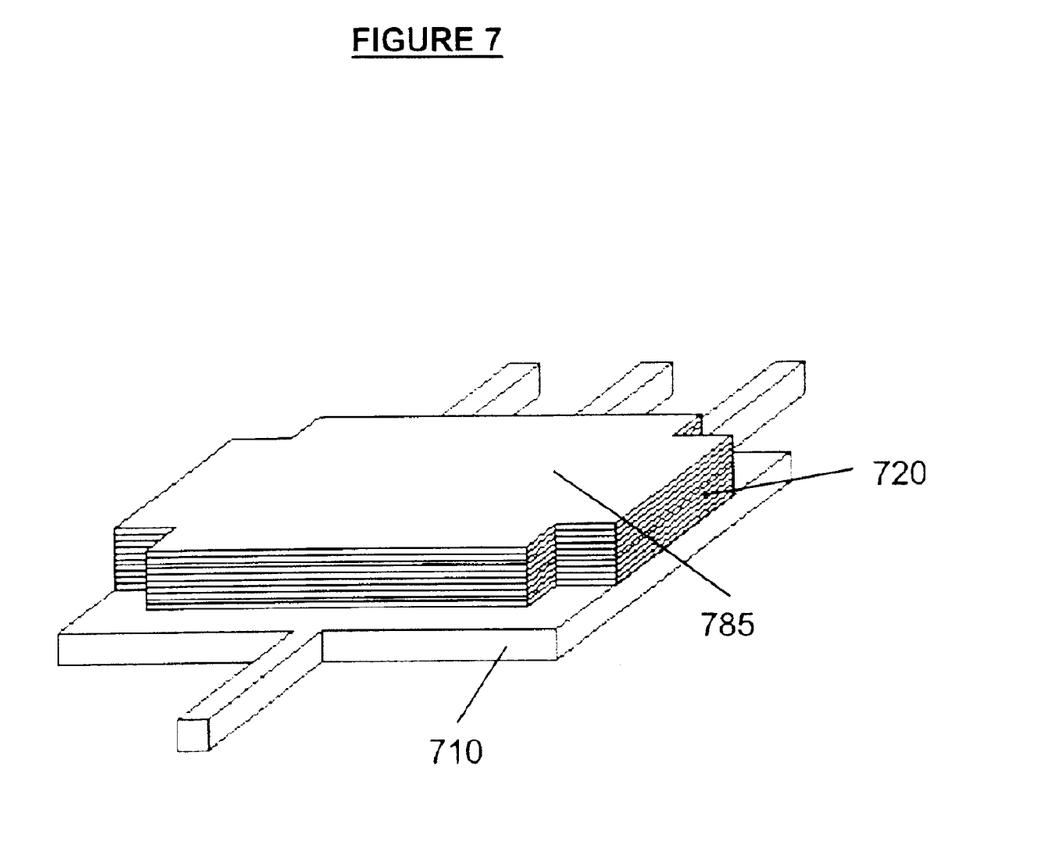
FIG. 7 depicts an alternative version with a patterned, as opposed to uniform, active layer.

FIG. 7 is the equivalent to FIG. 5 for the alternate embodiment of FIG. 3. The active region 720 is in the cross shape as depicted generally in FIG. 3.

Figure 8:
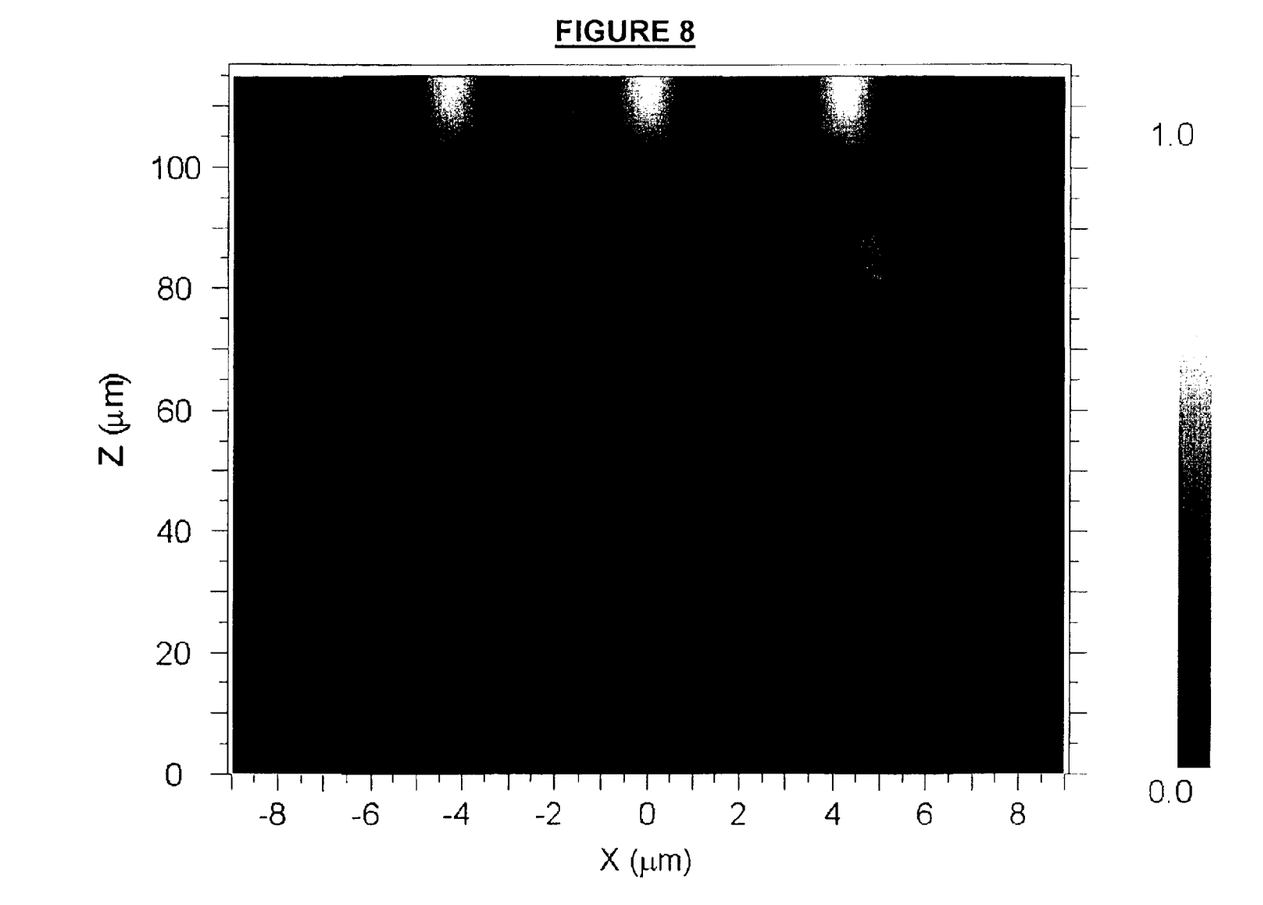
FIG. 8 depicts a numerical simulation for the device of FIG. 2 showing the various multi-mode interference patterns along the propagation direction.

FIG. 8 depicts a numerical simulation for the device of FIG. 2, using an amplification factor of 2.5X per channel, and showing the output signal power in each of the three copies of the input signal. In FIG. 8, light intensity is depicted as white, and absence of light as black. As can be seen, the input is center-fed to the simulated device, where both the X and Z co-ordinates are 0, and through the process of multimodal interference and amplification three output signals are generated each at 2.5 the optical power of the input signal. The outputs are seen at the top of the figure, where one output is at the same X co-ordinate as the input signal, and the other two outputs are at approximately X={−4.5, +4.5} microns, and all three outputs share a Z co-ordinate of approximately Z=115 microns.

While the above describes the preferred embodiments of the invention, various modifications or additions will be apparent to those of skill in the art. Such modifications and additions are intended to be covered by the following claims.

What is claimed:

1. A method of all-optical simultaneous multiple reproduction of optical signals, comprising:

inputting an optical signal into a waveguide;

propogating the optical signal through an MMI with amplification section such that the optical signal is multiplied and amplified at the same time; and outputting N copies of the input signal via N output waveguides.

2. The method of claim 1, where the input and output waveguides are monomodal.

3. The method of claim 2, where the amplification section is an active structure provided on top of the MMI.

4. The method of claim 3, where the length of the MMI with amplification section is a function of the effective width of the MMI and the desired number of outputs N.

5. Apparatus for all-optical simultaneous multiple reproduction of optical signals, comprising:

an input waveguide for inputting an optical signal;

a passive multimode waveguide for multiplying the input optical signal into N copies of the input optical signal;

an active structure provided on top of the passive waveguide for amplifying the input optical signal such that the input optical signal is multiplied and amplified at the same time; and N output waveguides for outputting the N copies of the input optical signal.

6. The apparatus of claim 5, where the length of the passive waveguide is a function of the effective width of the waveguide and the number of outputs N.

7. The apparatus of claim 6, where the passive waveguide comprises InGaAsP.

8. The apparatus of claim 7, where the active structure comprises alternating layers of and $In_xGa_{1-x}As_yP_{1-y}$ and $In_xGa_{1-x}As$.

9. A method of all-optical simultaneous multiple reproduction of optical signals comprising:

optically multiplying and amplifying an input optical signal at the same time to generate multiple copies of the input signal.

10. The method of claim 9 wherein said multiplying is realized by propagating the input optical signal through a passive multimode waveguide.

11. The method of claim 10 wherein said amplifying is carried out by an active structure while the input signal is propagating through the passive waveguide.

12. The method of claim 11 wherein said active structure is provided on top of said passive multimode waveguide.

13. The method of claim 12 wherein said passive multimode waveguide is a multimode interferometer (MMI).

14. The method of claim 13 wherein said multiplying is realized by constructive interference in the multimode interferometer.

15. The method of claim 14 further comprising inputting the input optical signal to the multimode interferometer through an input port.

16. The method of claim 15 further comprising outputting said generated multiple copies of the input signal through multiple output ports.

17. The method of claim 16 wherein said input port is a single channel waveguide.

18. Apparatus for all-optical simultaneous multiple reproduction of optical signals comprising:

an input port for inputting an input optical signal;

a multiplication region for multiplying the input optical signal into multiple copies of the input signal;

an amplification region for amplifying the input optical signal;

multiple output ports for outputting the multiple copies of the input signal, wherein the amplification region and the multiplication region are arranged such that the input optical signal is multiplied and amplified at the same time.

19. The apparatus of claim 18 wherein the multiplication region is formed by a passive multimode waveguide.

20. The apparatus of claim 19 wherein the amplification region is formed by an active layer.

21. The apparatus of claim 20 wherein the active layer is provided on the top of the passive multimode waveguide.

22. The apparatus of claim 21 wherein the passive multimode waveguide and th active layer are formed as a single piece in structure.

23. The apparatus of claim 19 wherein the passive multimode waveguide is a multimode interferometer.

24. The apparatus of claim 20 wherein the active layer is shaped as a cross pattern.

25. The apparatus of claim 20 further comprises a metal contact provided on the active layer.

26. The apparatus of claim 25 wherein the metal contact closely matches the active layer in shape.

27. The apparatus of clam 18 wherein the input port is a single channel waveguide.

* * * * *